(12) United States Patent
Kim et al.

(10) Patent No.: US 9,583,171 B2
(45) Date of Patent: Feb. 28, 2017

(54) WRITE DRIVER CIRCUITS FOR RESISTIVE RANDOM ACCESS MEMORY (RAM) ARRAYS

(71) Applicant: QUALCOMM Incorporated, San Diego, CA (US)

(72) Inventors: Jung Pill Kim, San Diego, CA (US); Sungryul Kim, San Diego, CA (US); Taehyun Kim, Cupertino, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 14/644,631

(22) Filed: Mar. 11, 2015

(65) Prior Publication Data

US 2016/0267959 A1    Sep. 15, 2016

(51) Int. Cl.
*G11C 13/00* (2006.01)
*G11C 11/16* (2006.01)

(52) U.S. Cl.
CPC ...... *G11C 11/1675* (2013.01); *G11C 11/1653* (2013.01); *G11C 11/1655* (2013.01); *G11C 13/0023* (2013.01); *G11C 13/0026* (2013.01); *G11C 13/0069* (2013.01); *G11C 2013/0073* (2013.01); *G11C 2213/79* (2013.01); *G11C 2213/82* (2013.01)

(58) Field of Classification Search
CPC .................................................. G11C 11/1675
See application file for complete search history.

(56) References Cited

U.S. PATENT DOCUMENTS

| 7,057,924 | B2 | 6/2006 | Lammers et al. | |
|---|---|---|---|---|
| 7,599,237 | B2 | 10/2009 | Jung et al. | |
| 7,626,860 | B2 | 12/2009 | Lamorey et al. | |
| 7,944,734 | B2 | 5/2011 | Lamorey | |
| 8,036,026 | B2 | 10/2011 | Rho et al. | |
| 2004/0223354 | A1* | 11/2004 | Lee .......................... | G11C 7/10 365/145 |
| 2007/0236987 | A1* | 10/2007 | Cho .......................... | G11C 8/10 365/163 |
| 2008/0094916 | A1 | 4/2008 | Fasoli | |

(Continued)

OTHER PUBLICATIONS

International Search Report and Written Opinion for PCT/US2016/020198, mailed Apr. 20, 2016, 13 pages.

*Primary Examiner* — Khamdan Alrobaie
(74) *Attorney, Agent, or Firm* — Withrow & Terranova, PLLC

(57) ABSTRACT

Aspects disclosed in the detailed description include write driver circuits for resistive random access memory (RAM) arrays. In one aspect, a write driver circuit is provided to facilitate writing data into a resistive RAM array in a memory system. The write driver circuit is coupled to a selector circuit configured to select a memory bitcell(s) in the resistive RAM array for a write operation. An isolation circuit is provided in the write driver circuit to couple a current source to the selector circuit to provide a write voltage during the write operation and to isolate the current source from the selector circuit when the selector circuit is not engaged in the write operation. By isolating the selector circuit from the current source when the selector circuit is on standby, it is possible to reduce leakage current in the selector circuit, thus reducing standby power consumption in the memory system.

26 Claims, 12 Drawing Sheets

(56) References Cited

U.S. PATENT DOCUMENTS

| | | | |
|---|---|---|---|
| 2008/0175041 A1* | 7/2008 | Aoki | G11C 11/15 365/158 |
| 2011/0280057 A1* | 11/2011 | Kim | G11C 29/02 365/148 |
| 2012/0155157 A1* | 6/2012 | Oh | G11C 11/1675 365/158 |
| 2012/0257437 A1* | 10/2012 | Seko | G11C 11/5678 365/148 |
| 2013/0215681 A1 | 8/2013 | Tang | |
| 2013/0258766 A1 | 10/2013 | Conte et al. | |
| 2013/0272060 A1 | 10/2013 | Andre et al. | |
| 2014/0098592 A1* | 4/2014 | Lee | G11C 13/004 365/145 |
| 2014/0219002 A1* | 8/2014 | Lee | G11C 11/1675 365/148 |

* cited by examiner

WRITE DRIVER CIRCUITS FOR RESISTIVE RANDOM ACCESS MEMORY (RAM) ARRAYS

BACKGROUND

I. Field of the Disclosure

The technology of the disclosure relates generally to resistive memory, and particularly to write driver circuits for performing write operations in resistive memory arrays.

II. Background

Processor-based computer systems include memory for data storage. Memory systems are composed of memory bitcells capable of storing data, wherein the form of the stored data depends on the type of memory employed. Magnetoresistive random access memory (MRAM) is an example of non-volatile memory in which data is stored by programming a magnetic tunnel junction (MTJ) of an MRAM bitcell. Data is stored in an MTJ as a magnetic state, wherein no electric current is required to preserve a stored data value. Thus, an MTJ can store data even when power is not supplied to the MTJ. Conversely, memory that stores data in the form of an electric charge, such as a static random access memory (SRAM), requires power to preserve a stored data value. Thus, because an MTJ may store information even when power is turned off, particular circuits and systems may benefit from employing MRAM.

In this regard, FIG. 1 illustrates an exemplary MRAM bitcell 10 that includes a metal-oxide semiconductor (typically n-type MOS, i.e., NMOS) access transistor 12 integrated with an MTJ 14 for storing non-volatile data. The MRAM bitcell 10 may be provided in an MRAM memory used as memory storage for any type of system requiring electronic memory, such as a central processing unit (CPU) or a processor-based system, as examples. The MTJ 14 includes a pinned layer 16 and a free layer 18 disposed on either side of a tunnel barrier 20 formed by a thin non-magnetic dielectric layer. When the magnetic orientation of the pinned layer 16 and the free layer 18 are anti-parallel (AP) to each other, an AP state exists (e.g., a logical '1'). When the magnetic orientation of the pinned layer 16 and the free layer 18 are parallel (P) to each other, a P state exists (e.g., a logical '0'). Further, the access transistor 12 controls reading and writing data to the MTJ 14. A drain (D) of the access transistor 12 is coupled to a bottom electrode 22 of the MTJ 14, which is coupled to the pinned layer 16. A word line 24 is coupled to a gate (G) of the access transistor 12. A source (S) of the access transistor 12 is coupled to a source line 26, which is coupled to a write driver circuit 28. A bit line 30 is coupled to the write driver circuit 28 and a top electrode 32 of the MTJ 14, which is coupled to the free layer 18.

With continuing reference to FIG. 1, when writing data to the MTJ 14, the gate G of the access transistor 12 is activated by activating the word line 24, which couples a write switching current ($I_{SW}$) ("switching current ($I_{SW}$)") from the write driver circuit 28 on the source line 26 to the bottom electrode 22. The $I_{SW}$ provided by the write driver circuit 28 to the MTJ 14 must be strong enough to change the magnetic orientation of the free layer 18. If the magnetic orientation is to be changed from the AP state to the P state, a current flowing from the top electrode 32 to the bottom electrode 22 induces a spin transfer torque (STT) at the free layer 18 that can change the magnetic orientation of the free layer 18 to P with respect to the pinned layer 16. If the magnetic orientation is to be changed from the P state to the AP state, a current flowing from the bottom electrode 22 to the top electrode 32 induces an STT at the free layer 18 to change the magnetic orientation of the free layer 18 to AP with respect to the pinned layer 16.

Because the MTJ 14 is a resistive memory element with a given resistance ($R_{MTJ}$), applying the $I_{SW}$ to the MTJ 14 during a write operation will generate voltage ($V_{MTJ}$) across the MTJ 14 according to $V_{MTJ}=I_{SW}*R_{MTJ}$. However, the $I_{SW}$ should not exceed a defined current level for the MTJ 14, because the MTJ 14 will incur electrical breakdown if the $V_{MTJ}$ generated across the MTJ 14 exceeds a certain breakdown voltage ($V_{BD}$). With continuing reference to FIG. 1, the MTJ 14 is unable to function as a resistive memory element while in a breakdown state. As the tunnel barrier 20 of the MTJ 14 becomes thinner, breakdown of the MTJ 14 occurs at a lower $V_{BD}$. Thus, the write driver circuit 28 must generate a strong enough $I_{SW}$ to change the magnetic orientation of the free layer 18 in the MTJ 14. However, a higher $I_{SW}$ may cause the $V_{MTJ}$ across the MTJ 14 to exceed $V_{BD}$ of the MTJ 14, thus causing the free layer 18 in the MTJ 14 to not switch properly. Further, process, voltage, and temperature (PVT) variations that can occur during MTJ 14 fabrication can cause the $R_{MTJ}$ of certain MTJs 14 to be higher, thus increasing $V_{MTJ}$ across the MTJ 14 for a given $I_{SW}$.

With continuing reference to FIG. 1, the access transistor 12 is not activated by the word line 24 when not writing data to the MTJ 14. However, a leakage current (not shown), occurs in the access transistor 12 when a voltage is applied between the source line 26 and the bit line 30. This undesirable leakage current increases standby power consumption of the MRAM bitcell 10 when not reading or writing data to the MTJ 14.

SUMMARY OF THE DISCLOSURE

Aspects disclosed in the detailed description include write driver circuits for resistive random access memory (RAM) arrays. In one aspect, a write driver circuit is provided to facilitate writing data into a resistive RAM array in a memory system. The write driver circuit is coupled to a selector circuit configured to select a memory bitcell(s) in the resistive RAM array for a write operation. An isolation circuit is provided in the write driver circuit to couple a current source to the selector circuit to provide a write voltage during the write operation. The isolation circuit is further configured to isolate the current source from the selector circuit when the selector circuit is not engaged in the write operation (e.g., on standby). By isolating the selector circuit from the current source when the selector circuit is on standby, it is possible to reduce leakage current in the selector circuit, thus reducing standby power consumption in the memory system.

In a further non-limiting aspect, a precharging circuit can be provided in the write driver circuit to reduce voltage change in the selector circuit when the selector circuit is coupled to the current source to enable the write operation. The precharging circuit is controlled to pre-charge the selector circuit to a precharge voltage, which is lower than the write voltage, when the selector circuit is isolated from the current source by the isolation circuit. As a result, the selector circuit experiences a reduced voltage change when the selector circuit is coupled to the current source to enable the write operation, thus leading to a reduced size of active components in the selector circuit.

In this regard, in one aspect, a write driver circuit for writing data to a resistive RAM array is provided. The write driver circuit comprises an isolation circuit. The isolation circuit is coupled to a current source. The isolation circuit is also coupled to a selector circuit configured to select one or more resistive RAM bitcells in the resistive RAM array for a write operation. The isolation circuit is configured to receive a control signal. The isolation circuit is also configured to couple the current source to the selector circuit to provide a write voltage to the one or more resistive RAM bitcells selected by the selector circuit if the control signal indicates a write state for the write operation. The isolation circuit is also configured to decouple the current source from the selector circuit if the control signal does not indicate the write state.

In another aspect, a means for writing data to a resistive RAM array is provided. The means for writing data comprises a means for isolation. The means for isolation is coupled to a current source. The means for isolation is also coupled to a selector circuit configured to select one or more resistive RAM bitcells in the resistive RAM array for a write operation. The means for isolation is configured to receive a control signal. The means for isolation is also configured to couple the current source to the selector circuit to provide a write voltage to the one or more resistive RAM bitcells selected by the selector circuit if the control signal indicates a write state for the write operation. The means for isolation is also configured to decouple the current source from the selector circuit if the control signal does not indicate the write state.

In another aspect, a method for providing a write voltage to a resistive RAM array during write operation is provided. The method comprises receiving a control signal by an isolation circuit. The method also comprises coupling a current source to a selector circuit if the control signal indicates a write state, wherein the current source is configured to provide the write voltage to one or more resistive RAM bitcells selected by the selector circuit for the write operation. The method also comprises decoupling the current source from the selector circuit if the control signal does not indicate the write state.

In another aspect, a resistive RAM system is provided. The resistive RAM system comprises a resistive RAM array comprising a plurality of resistive RAM bitcells arranged into M rows and N columns, wherein M and N are finite integers. Each of the M rows comprises N resistive RAM bitcells coupled to a respective word line (WL). Each of the N columns comprises M resistive RAM bitcells coupled to a respective bit line (BL) and a respective source line (SL). The resistive RAM system also comprises a selector circuit comprising N coupling elements, wherein each of the N coupling elements is coupled to a respective column among the N columns in the resistive RAM array. The resistive RAM system also comprises a write driver circuit. The write driver circuit comprises an isolation circuit coupled to the selector circuit and a current source.

DETAILED DESCRIPTION

Figure 1:
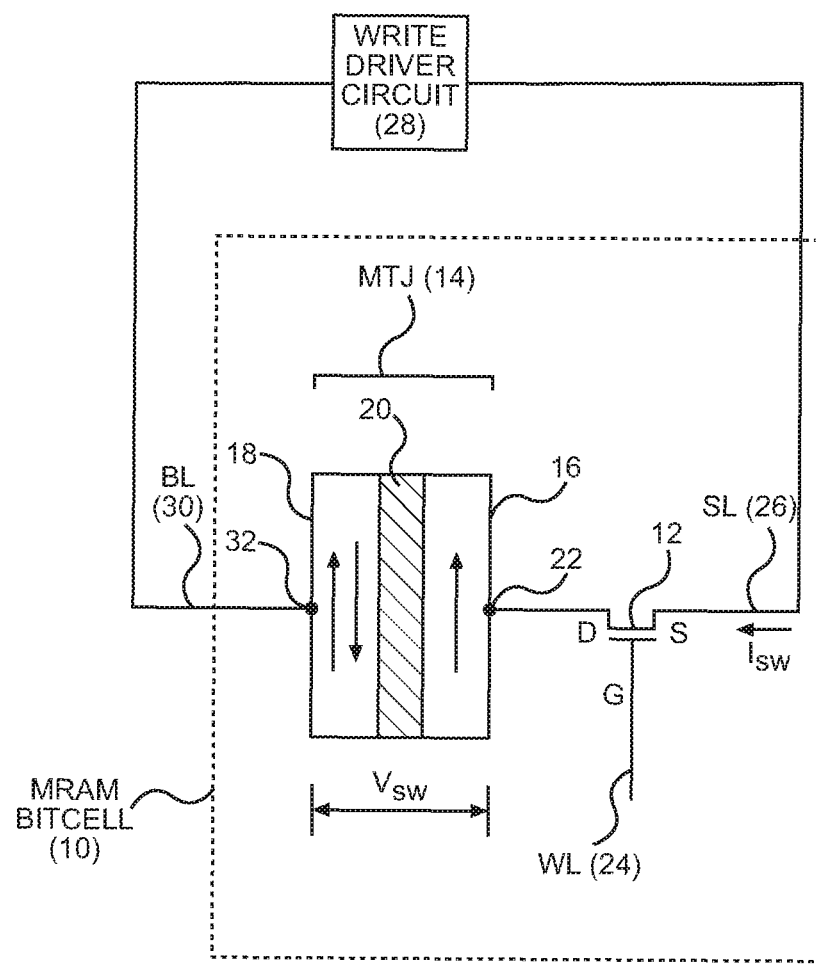
FIG. 1 is a diagram of an exemplary magnetoresistive random access memory (MRAM) bitcell employing a magnetic tunnel junction (MTJ) and a write driver circuit configured to write data into the MRAM bitcell.

With reference now to the drawing figures, several exemplary aspects of the present disclosure are described. The word "exemplary" is used herein to mean "serving as an example, instance, or illustration." Any aspect described herein as "exemplary" is not necessarily to be construed as preferred or advantageous over other aspects.

Aspects disclosed in the detailed description include write driver circuits for resistive random access memory (RAM) arrays. In one aspect, a write driver circuit is provided to facilitate writing data into a resistive RAM array in a memory system. The write driver circuit is coupled to a selector circuit configured to select a memory bitcell(s) in the resistive RAM array for a write operation. An isolation circuit is provided in the write driver circuit to couple a current source to the selector circuit to provide a write voltage during the write operation. The isolation circuit is further configured to isolate the current source from the selector circuit when the selector circuit is not engaged in the write operation (e.g., on standby). By isolating the selector circuit from the current source when the selector circuit is on standby, it is possible to reduce leakage current in the selector circuit, thus reducing standby power consumption in the memory system.

Magnetoresistive RAM (MRAM) is one type of resistive RAM and is referenced hereinafter in the present disclosure as a non-limiting example. Accordingly, an MRAM array, an MRAM bitcell, and an MRAM system are non-limiting examples of a resistive RAM array, a resistive RAM bitcell, and a resistive RAM system, respectively.

Figure 2:
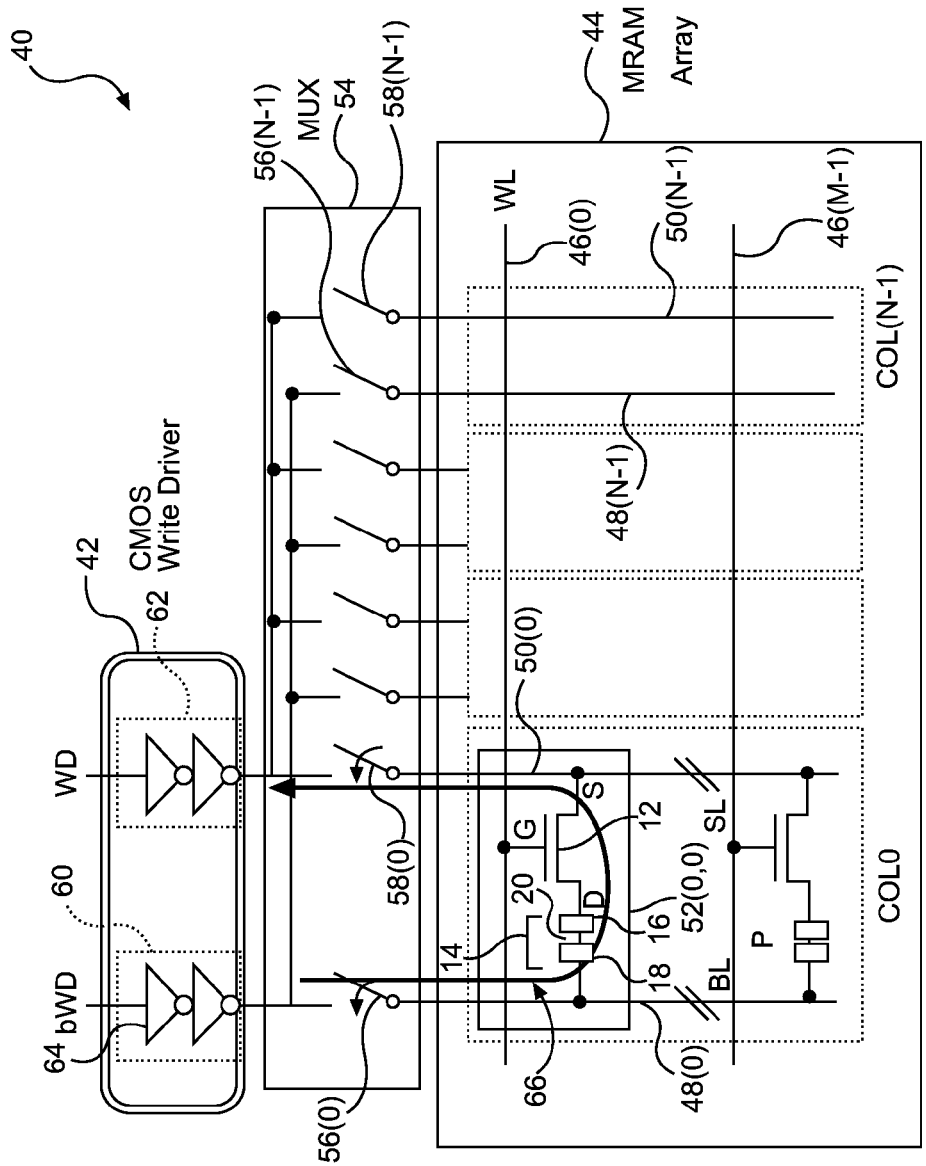
FIG. 2 is a diagram of an exemplary MRAM comprising a complementary metal-oxide semiconductor (CMOS) write driver for coupling a current source to an MRAM array to write data into the MTJ in FIG. 1 of the respective MRAM bitcell in the MRAM array.
Figure 3A:
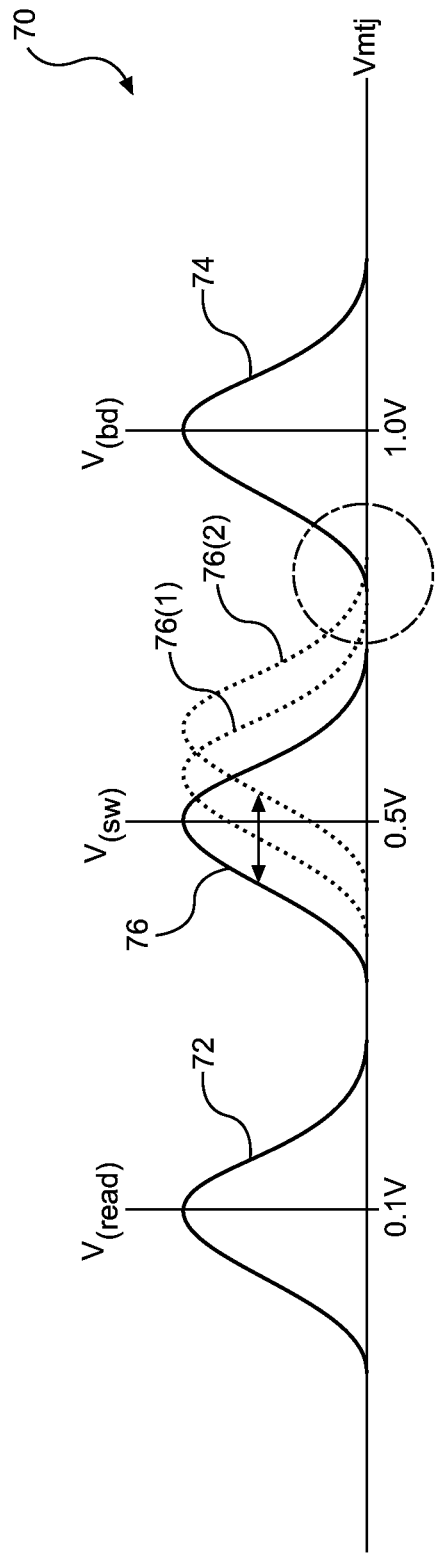
FIG. 3A is a voltage distribution graph illustrating an exemplary switching voltage distribution curve and the effects of switching current variations resulting from process, voltage, and temperature (PVT) variations in the MTJ of FIG. 2.
Figure 3B:
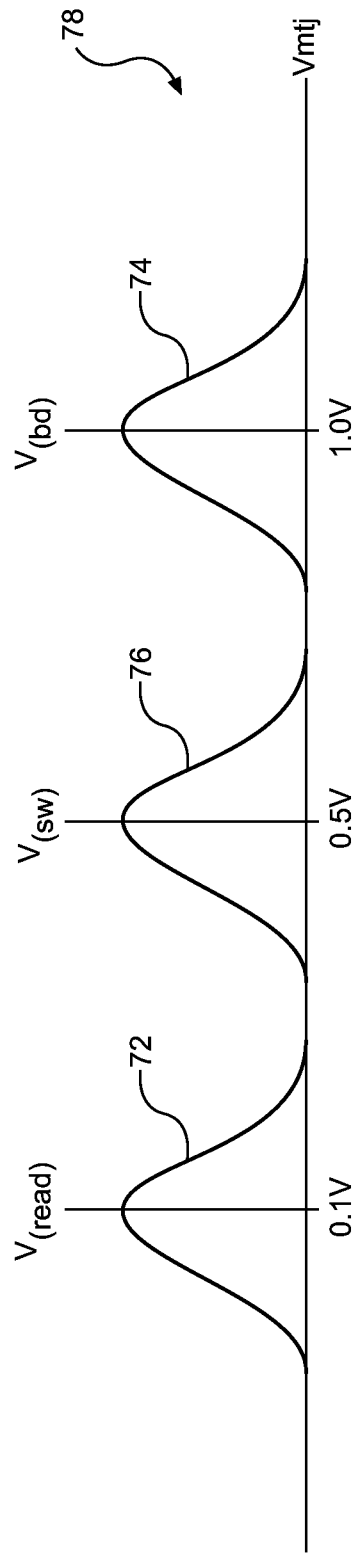
FIG. 3B is a voltage distribution graph illustrating an exemplary switching voltage distribution curve when the effects of switching current variations resulting from PVT variations in the MTJ of FIG. 2 are properly contained.

Before discussing aspects of a write driver circuit for an MRAM system, a brief overview of a conventional approach for writing data into an MRAM bitcell and various aspects of switching current variations resulting from process, voltage, and temperature (PVT) variations are provided with reference to FIGS. 2-3B. The specific exemplary aspects of the write driver circuit for reducing a leakage current in the MRAM system are first discussed with regard to FIGS. 4-6. The discussion of exemplary aspects of the write driver circuit for reducing switching current variations in the MRAM system starts in FIG. 7.

In this regard, FIG. 2 is a diagram of an exemplary MRAM 40 comprising a complementary metal-oxide semiconductor (CMOS) write driver 42 for coupling a current source (not shown) to an MRAM array 44 to write data into the MTJ 14 in FIG. 1 of a respective MRAM bitcell in the MRAM array 44.

A typical MRAM array is an M by N (M×N) matrix comprising M rows and N columns, where M and N are finite integers. Each of the M rows is associated with a respective word line (WL) among M WLs 46(0)-46(M−1). In this regard, the M WLs 46(0)-46(M−1) are configured to address row 0 to row (M−1), respectively. Each of the N columns is controlled by a respective bit line (BL) among N BLs 48(0)-48(N−1) and a respective source line (SL) among N SLs 50(0)-50(N−1). In this regard, the N BLs 48(0)-48(N−1) and the N SLs 50(0)-50(N−1) are configured to control columns 0 to (N−1) of the MRAM array 44, respectively. Accordingly, an MRAM bitcell 52(0,0) is located at row 0 and column 0 of the MRAM array 44. The MRAM bitcell 52(0,0) is addressed by the WL 46(0) and controlled by the BL 48(0) and the SL 50(0).

With reference to FIG. 2, the MRAM 40 also comprises a multiplexer (MUX) 54. The MUX 54 comprises N BL switches 56(0)-56(N−1) configured to be alternately coupled to the N BLs 48(0)-48(N−1), respectively. The MUX 54 also comprises N SL switches 58(0)-58(N−1) configured to be alternately coupled to the N SLs 50(0)-50(N−1), respectively. In a non-limiting example, the N BL switches 56(0)-56(N−1) and the N SL switches 58(0)-58(N−1) are transistors (e.g., input/output (I/O) transistors). The CMOS write driver 42 comprises a first element 60 configured to be coupled to one of the N BL switches 56(0)-56(N−1). The CMOS write driver 42 also comprises a second element 62 configured to be coupled to one of the N SL switches 58(0)-58(N−1). In a non-limiting example, the first element 60 and the second element 62 are each implemented by one or more amplifiers 64 according to a serial arrangement. To write a parallel (P) state (e.g., a logical '0') in the MRAM bitcell 52(0,0), the BL switch 56(0) and the SL switch 58(0) in the MUX 54 are both closed, thus coupling the first element 60 and the second element 62 to the BL 48(0) and the SL 50(0), respectively. A switching current 66 is provided by the CMOS write driver 42 and flows through the first element 60 and across the MRAM bitcell 52(0,0) from the BL 48(0) to the SL 50(0).

As previously discussed in FIG. 1, the switching current 66 in FIG. 2 causes the free layer 18 in the MTJ 14 of the MRAM bitcell 52(0,0) to change from an anti-parallel (AP) state to the P state. Because the MTJ 14 is a resistive memory element with a given resistance ($R_{MTJ}$) (not shown), applying the switching current 66 to the MTJ 14 during a write operation will generate voltage ($V_{MTJ}$) (not shown) across the MTJ 14 according to Ohm's law. However, the switching current 66 should not exceed a defined current level for the MTJ 14, because the MTJ 14 will incur electrical breakdown if the $V_{MTJ}$ (not shown) generated across the MTJ 14 exceeds a certain breakdown voltage ($V_{BD}$). The MTJ 14 is unable to function as a resistive memory element while in a breakdown state. As the tunnel barrier 20 of the MTJ 14 becomes thinner, breakdown of the MTJ 14 occurs at a lower breakdown voltage ($V_{BD}$). Because the CMOS write driver 42 is not configured to properly regulate the switching current 66 provided to the MRAM array 44, the switching current 66 may vary during the write operation, thus causing the $V_{MTJ}$ to vary as well. Further, due to PVT variations that can occur during fabrication of the MTJ 14, multiple MTJs 14 of the same design and fabrication process may experience varying electrical impedances. As a result, the switching current 66 among the multiple MTJs 14 may vary even when the same switching voltage (not shown) is applied for the multiple MTJs 14. In this regard, FIG. 3A is a voltage distribution graph 70 illustrating an exemplary switching voltage distribution curve and the effects of switching current variations resulting from PVT variations in the MTJ 14 of FIG. 2.

With reference to FIG. 3A, a horizontal axis ($V_{mtj}$) in the voltage distribution graph 70 illustrates different voltages applied to the MTJ 14 (not shown). A read voltage distribution curve $V_{(read)}$ 72 is associated with a zero point one (0.1) volt (V) voltage on the $V_{mtj}$, indicating that reading data from the MRAM bitcell 52(0,0) (not shown) requires a 0.1V voltage to be applied across the MTJ 14. A breakdown voltage distribution curve $V_{(bd)}$ 74 is associated with a one (1) V voltage on the $V_{mtj}$, indicating that a breakdown occurs in the MTJ 14 if voltage applied across the MTJ 14 exceeds 1V. A switching voltage distribution curve $V_{(sw)}$ 76 is associated with a zero point five (0.5) V voltage on the $V_{mtj}$, indicating that a 0.5V switching voltage needs to be applied across the MTJ 14 so as to generate the switching current 66 (not shown) to change the MTJ 14 from the AP state to the P state. According to Ohm's law, the switching current 66 is proportionally related to the switching voltage and inversely related to resistance of the MTJ 14. When resistance of the MTJ 14 increases due to PVT variations, the switching voltage applied across the MTJ 14 must increase proportionally to provide the switching current 66 required to change the MTJ 14 from the AP state to the P state, or vice versa. Consequently, the switching voltage distribution curve $V_{(sw)}$ 76 is shifted toward switching voltage distributions 76(1), 76(2). As the switching voltage continues to increase, breakdown of the MTJ 14 may eventually occur.

In contrast to the voltage distribution graph 70, FIG. 3B is a voltage distribution graph 78 illustrating the switching voltage distribution curve $V_{(sw)}$ 76 when the effects of switching current variations resulting from PVT variations in the MTJ 14 of FIG. 2 are properly contained. Common elements between FIG. 3A and FIG. 3B are shown with common element numbers, and thus will not be re-described herein. Unlike in FIG. 3A, the switching voltage distribution curve $V_{(sw)}$ 76 does not move if switching current variations resulted from the PVT variations are effectively reduced.

Further, if the CMOS write driver 42 in FIG. 2 remains coupled to the current source while not writing data into the MRAM bitcell 52(0,0), the static power consumption of the MUX 54 increases as a result of an undesirable leakage current (not shown) in the BL switch 56(0) and the SL switch 58(0). It is thus desirable to eliminate or reduce this undesirable leakage current in the MUX 54 when the MRAM bitcell 52(0,0) is not selected for write operation.

Figure 4:
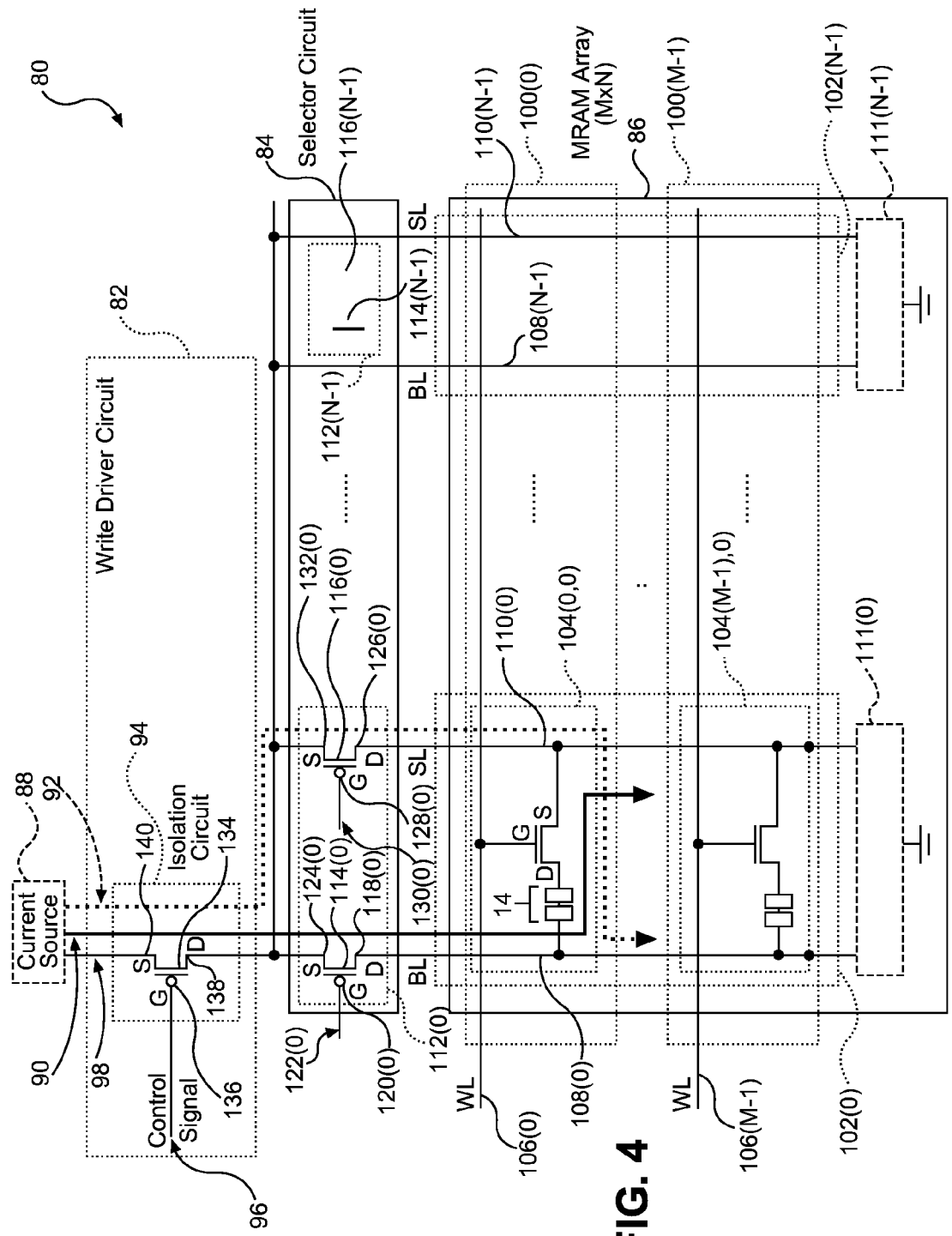
FIG. 4 is a diagram of an exemplary MRAM system comprising a write driver circuit configured to reduce a leakage current in a selector circuit, which is configured to select an MRAM bitcell(s) in an MRAM array for a write operation.

In this regard, FIG. 4 is a diagram of an exemplary MRAM system 80 comprising a write driver circuit 82 configured to reduce a leakage current in a selector circuit 84, which is configured to select an MRAM bitcell(s) in an MRAM array 86 for a write operation. The write driver circuit 82 is coupled to a current source 88, which is configured to generate switching currents 90, 92 to at least one MRAM bitcell selected by the selector circuit 84 for a write operation. In a non-limiting example, the selector circuit 84 is a MUX circuit. The write driver circuit 82 comprises an isolation circuit 94. A control signal 96 is provided to indicate a write state during the write operation. In contrast, the control signal 96 does not indicate the write state if the selector circuit 84 does not select the MRAM bitcell for the write operation. When the selector circuit 84 is not selecting the MRAM bitcell for the write operation, the selector circuit 84 is hereinafter referred to as being on standby. During the write operation, the control signal 96 causes the isolation circuit 94 to couple the current source 88 to the selector circuit 84. The current source 88 provides a write voltage 98 to the selector circuit 84 and thus to the MRAM bitcell selected by the selector circuit 84. In a non-limiting example, the write voltage 98 is equal to a voltage $V_{IO}$. When the selector circuit 84 is on standby, the control signal 96 causes the isolation circuit 94 to decouple the current source 88 from the selector circuit 84. By decoupling the current source 88, and thus the write voltage 98, from the selector circuit 84 when the selector circuit 84 is on standby, the leakage current can be prevented in the selector circuit 84.

With continuing reference to FIG. 4, the MRAM array 86 is an M×N matrix comprising M rows 100(0)-100(M−1) and N columns 102(0)-102(N−1), where M and N are finite integers. In this regard, column '0' of the MRAM array 86 comprises M MRAM bitcells 104(0,0)-104((M−1),0). Since the M rows 100(0)-100(M−1) of the MRAM array 86 are addressed by M WLs 106(0)-106(M−1), respectively, the M MRAM bitcells 104(0,0)-104(0,(N−1)) are thus addressed by the WL 106(0). The N columns 102(0)-102(N−1) of the MRAM array 86 are controlled by N BLs 108(0)-108(N−1) and N SLs 110(0)-110(N−1), respectively. In this regard, to write data into the MRAM bitcell 104(0,0) for example, the WL 106(0) must be asserted first to select the row 100(0). In addition, the BL 108(0) or the SL 110(0) is asserted to write a logical '0' or a logical '1' into the MRAM bitcell 104(0,0). The N columns 102(0)-102(N−1) of the MRAM array 86 further comprise N write current sinks 111(0)-111(N−1). As discussed later in FIG. 6, the N write current sinks 111(0)-111(N−1) are configured to ground the switching currents 90, 92.

With continuing reference to FIG. 4, the selector circuit 84 comprises N coupling elements 112(0)-112(N−1), wherein N is a finite integer. Each of the N coupling elements 112(0)-112(N−1) is coupled to a respective column among the N columns 102(0)-102(N−1) of the MRAM array 86. In a non-limiting example, the coupling element 112(0) is coupled to the column 102(0) of the MRAM array 86. The N coupling elements 112(0)-112(N−1) comprise N BL transistors 114(0)-114(N−1) and N SL transistors 116(0)-116(N−1), respectively. In this regard, during the write operation, the control signal 96 causes the isolation circuit 94 to couple the current source 88 to the N BL transistors 114(0)-114(N−1) and the N SL transistors 116(0)-116(N−1) in the selector circuit 84. As discussed later in FIG. 7, the N BL transistors 114(0)-114(N−1) and the N SL transistors 116(0)-116(N−1) may be core transistors that can help reduce the footprint of the selector circuit 84.

For the purpose of illustration, the coupling element 112(0) and the MRAM bitcell 104(0,0) are discussed hereinafter in the present disclosure as non-limiting examples. The principles and configurations discussed therein are applicable to all of the N coupling elements 112(0)-112(N−1) in the selector circuit 84 and all of the MRAM bitcells 104(0,0)-104((M−1),(N−1)) in the MRAM array 86.

With continuing reference to FIG. 4, the coupling element 112(0) comprises the BL transistor 114(0) and the SL transistor 116(0). The BL transistor 114(0) is coupled to the BL 108(0) by a BL transistor drain (D) terminal 118(0). The BL transistor 114(0) also comprises a BL transistor gate (G) terminal 120(0) configured to receive a BL-enablement signal 122(0). The BL transistor 114(0) also comprises a BL transistor source (S) terminal 124(0). Likewise, the SL transistor 116(0) is coupled to the SL 110(0) by an SL transistor D terminal 126(0). The SL transistor 116(0) also comprises an SL transistor G terminal 128(0) configured to receive an SL-enablement signal 130(0). The SL transistor 116(0) also comprises an SL transistor S terminal 132(0).

With continuing reference to FIG. 4, the isolation circuit 94 is configured to provide a means for isolation. In a non-limiting example, the isolation circuit 94 comprises an isolation transistor 134. The isolation transistor 134 comprises an isolation transistor G terminal 136, an isolation transistor D terminal 138, and an isolation transistor S terminal 140. The isolation transistor D terminal 138 is coupled to the BL transistor S terminal 124(0) and the SL transistor S terminal 132(0). The isolation transistor G terminal 136 is configured to receive the control signal 96. The isolation transistor S terminal 140 is coupled to the current source 88. The current source 88 is configured to provide the write voltage 98 to the isolation circuit 94. In a non-limiting example, the write voltage 98 is equal to a voltage $V_{IO}$.

Figure 5:
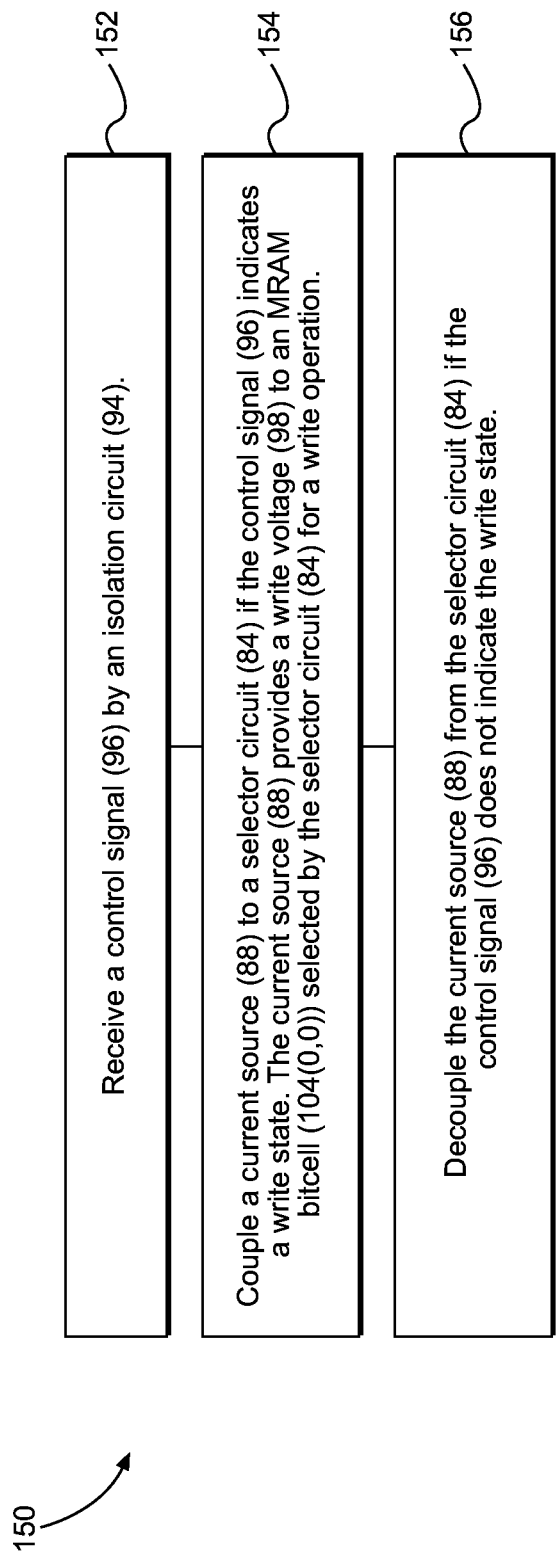
FIG. 5 is a flowchart illustrating an exemplary write driver process for reducing the leakage current in the selector circuit in FIG. 4 when the selector circuit is on standby.

FIG. 5 is a flowchart illustrating an exemplary write driver process 150 for reducing the leakage current in the selector circuit 84 in FIG. 4 when the selector circuit 84 is on standby. Elements of FIG. 4 are referenced in connection to FIG. 5 and will not be re-described herein. According to the write driver process 150, the isolation circuit 94 receives the control signal 96 (block 152). If the control signal 96 indicates the write state, the isolation circuit 94 couples the current source 88 to the selector circuit 84 to provide the write voltage 98 to the MRAM bitcell 104(0,0) selected by the selector circuit 84 for the write operation (block 154). If the control signal 96 does not indicate the write state, the isolation circuit 94 decouples the current source 88 from the selector circuit 84 (block 156).

Figure 6:
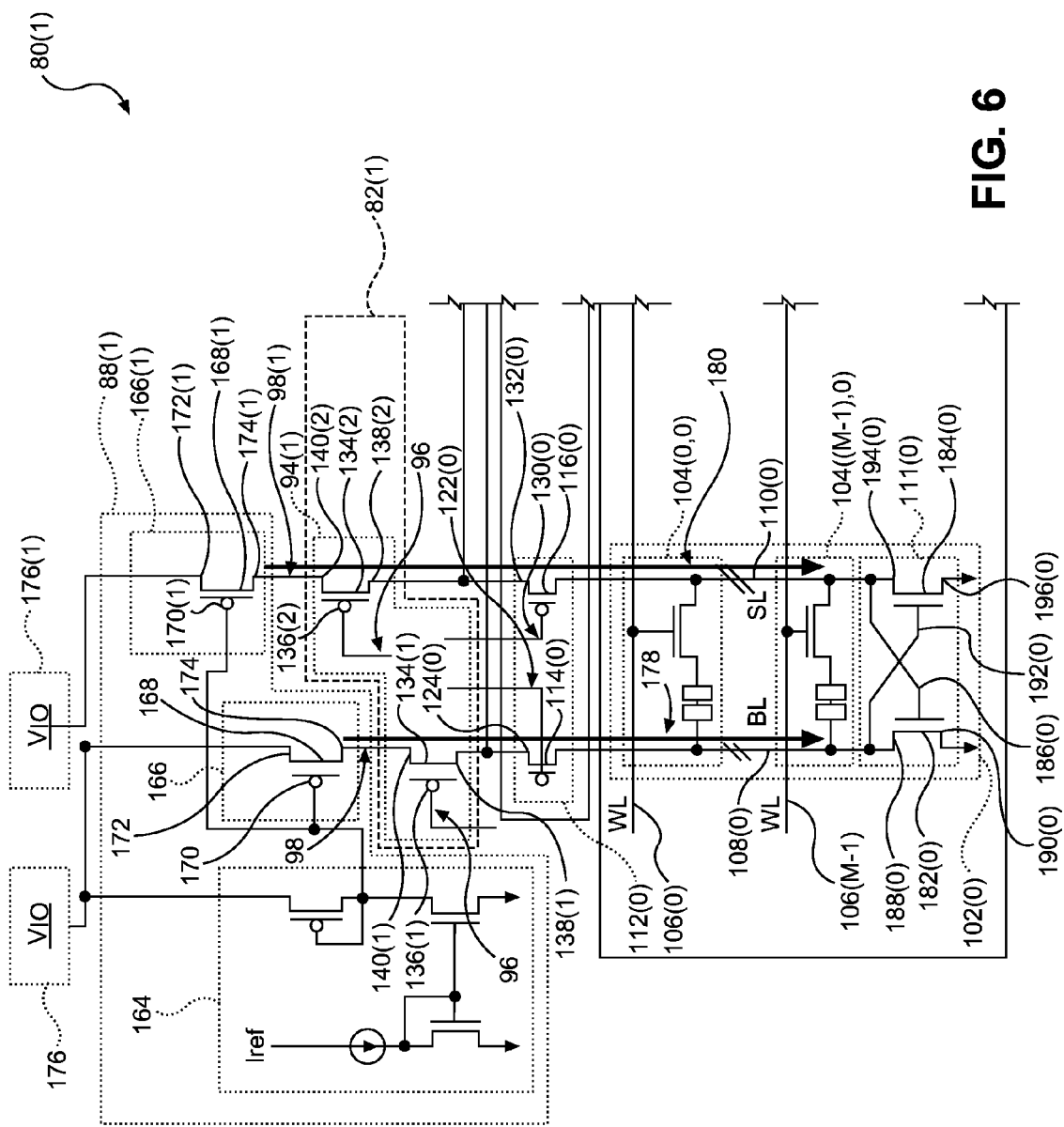
FIG. 6 is a diagram of an exemplary MRAM system comprising a write driver circuit wherein an isolation circuit is configured to couple bit lines (BLs) and source lines (SLs) to different current sources.
Figure 6:
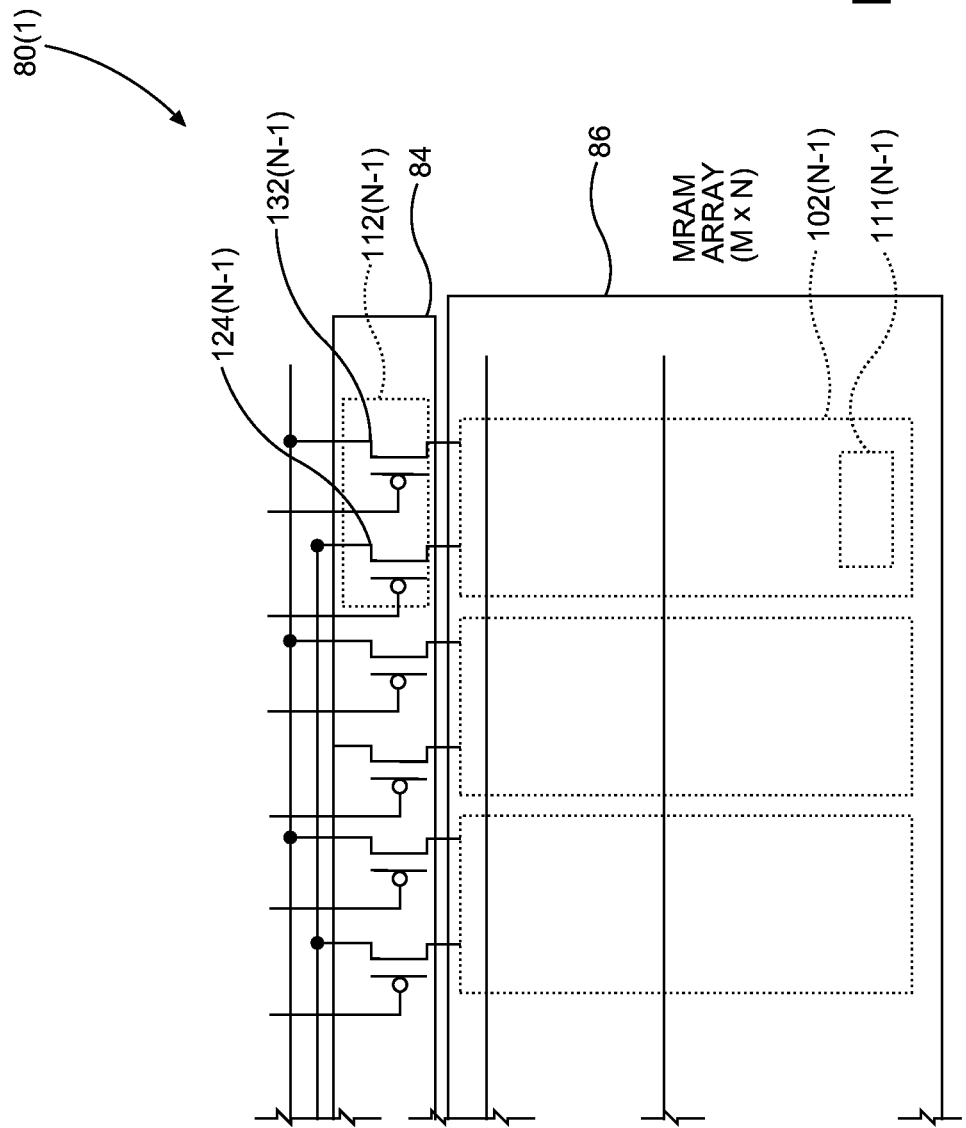

As illustrated in FIG. 4, the N BLs 108(0)-108(N−1) and the N SLs 110(0)-110(N−1) are both coupled to the current source 88. However, the N BLs 108(0)-108(N−1) and the N SLs 110(0)-110(N−1) in the MRAM system 80 may also be coupled to individual current sources. In this regard, FIG. 6 is a diagram of an exemplary MRAM system 80(1) comprising a write driver circuit 82(1) wherein an isolation circuit 94(1) is configured to couple the N BLs 108(0)-108(N−1) and the N SLs 110(0)-110(N−1) in FIG. 4 to different current sources. Common elements between FIGS. 4 and 6 are shown with common element numbers, and thus will not be re-described herein.

With reference to FIG. 6, the write driver circuit 82(1) comprises the isolation circuit 94(1), which is coupled to a current source 88(1). The current source 88(1) comprises a current mirror circuit 164, a BL current source 166, and an SL current source 166(1). In a non-limiting example, the BL current source 166 comprises a BL current source transistor 168. The BL current source transistor 168 comprises a BL current source transistor G terminal 170 coupled to the current mirror circuit 164, a BL current source transistor S terminal 172, and a BL current source transistor D terminal 174 configured to output the write voltage 98 (BL write voltage). The BL current source transistor S terminal 172 is coupled to a BL write voltage source 176. The BL write voltage source 176 provides a BL switching current 178. The SL current source 166(1) comprises an SL current source transistor 168(1). The SL current source transistor 168(1) comprises an SL current source transistor G terminal 170(1) coupled to the current mirror circuit 164, an SL current source transistor S terminal 172(1), and an SL current source transistor D terminal 174(1) configured to output an SL write voltage 98(1). The SL current source transistor S terminal 172(1) is coupled to an SL write voltage source 176(1). The SL write voltage source 176(1) provides an SL switching current 180. In a non-limiting example, the BL write voltage source 176 and the SL write voltage source 176(1) may both provide a voltage $V_{IO}$. Consequently, the BL write voltage 98 and the SL write voltage 98(1) may both equal to voltage $V_{IO}$.

With continuing reference to FIG. 6, the isolation circuit 94(1) comprises a BL isolation transistor 134(1) and an SL isolation transistor 134(2). The BL isolation transistor 134(1) comprises a BL isolation transistor G terminal 136(1), a BL isolation transistor D terminal 138(1) coupled to N BL transistor S terminals 124(0)-124(N−1) in the selector circuit 84, and a BL isolation transistor S terminal 140(1) coupled to the BL current source transistor D terminal 174. The SL isolation transistor 134(2) comprises an SL isolation transistor G terminal 136(2), an SL isolation transistor D terminal 138(2) coupled to N SL transistor S terminals 132(0)-132(N−1) in the selector circuit 84, and an SL isolation transistor S terminal 140(2) coupled to the SL current source transistor D terminal 174(1). The configuration discussed above makes it possible to provide the N BLs 108(0)-108(N−1) and the N SLs 110(0)-110(N−1) with the BL switching current 178 and the SL switching current 180, respectively, when needed.

With continuing reference to FIG. 6, the control signal 96 indicates the write state when the MRAM bitcell 104(0,0) is selected by the WL 106(0), the BL 108(0), and the SL 110(0) for the write operation. Accordingly, the BL isolation transistor 134(1) couples the BL current source 166 to the BL transistor 114(0) to provide the BL switching current 178 to the BL 108(0). Likewise, the SL isolation transistor 134(2) couples the SL current source 166(1) to the SL transistor 116(0) to provide the SL switching current 180 to the SL 110(0). In contrast, the control signal 96 does not indicate the write state when the MRAM bitcell 104(0,0) is not selected by the WL 106(0), the BL 108(0), and the SL 110(0) for the write operation. In this regard, the selector circuit 84 is on standby. Consequently, the BL isolation transistor 134(1) and the SL isolation transistor 134(2) decouple the BL current source 166 and the SL current source 166(1) from the BL transistor 114(0) and the SL transistor 116(0), respectively, to reduce the leakage current in the selector circuit 84.

With continuing reference to FIG. 6, the N write current sinks 111(0)-111(N−1) are coupled to the N columns 102(0)-102(N−1) in the MRAM array 86, respectively. In a non-limiting example, the write current sink 111(0) is coupled to a bottom of the column 102(0) and comprises a first write current sink transistor 182(0) and a second write current sink transistor 184(0). The first write current sink transistor 182(0) comprises a first write current sink transistor G terminal 186(0) coupled to the SL 110(0). The first write current sink transistor 182(0) also comprises a first write current sink transistor S terminal 188(0) coupled to the BL 108(0). The first write current sink transistor 182(0) also comprises a first write current sink transistor D terminal 190(0) coupled to a ground (GND). The second write current sink transistor 184(0) comprises a second write current sink transistor G terminal 192(0) coupled to the BL 108(0). The second write current sink transistor 184(0) also comprises a second write current sink transistor S terminal 194(0) coupled to the SL 110(0). The second write current sink transistor 184(0) also comprises a second write current sink transistor D terminal 196(0) coupled to the GND. By coupling the write current sink 111(0) to the bottom of the column 102(0), the BL switching current 178 and the SL switching current 180 may be properly terminated after flowing through the MRAM bitcell 104(0,0).

Figure 7:
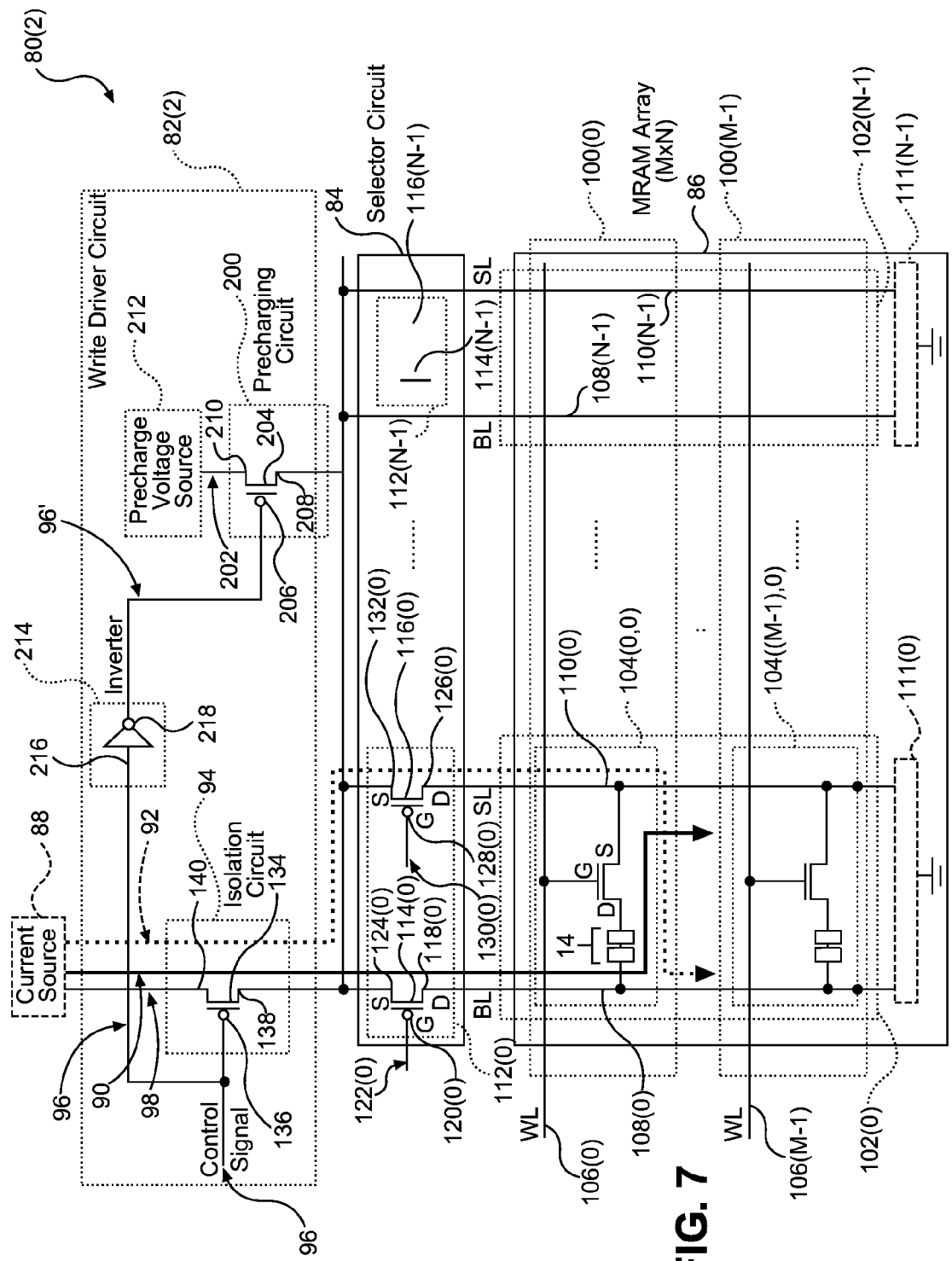
FIG. 7 is a diagram of an exemplary MRAM system comprising a write driver circuit configured to reduce voltage change in the selector circuit in FIG. 4 during a write operation, thus reducing footprint of the selector circuit.

As previously discussed in FIG. 4, the isolation circuit 94 decouples the current source 88 from the selector circuit 84 when the selector circuit 84 is on standby. During the write operation, the control signal 96 causes the isolation circuit 94 to couple the current source 88 to the selector circuit 84 to provide the write voltage 98 to the selector circuit 84. As a result, the selector circuit 84 is subject to a relatively large voltage change when the selector circuit 84 is coupled to the current source 88. Consequently, the N BL transistors 114(0)-114(N−1) and the N SL transistors 116(0)-116(N−1) in the selector circuit 84 must have relatively thick oxide layers to withstand the relatively large voltage change, thus leading to an increased footprint of the selector circuit 84. It is thus desirable to reduce the footprint of the selector circuit 84 by reducing sizes of the N BL transistors 114(0)-114(N−1) and the N SL transistors 116(0)-116(N−1). In this regard, FIG. 7 is a diagram of an exemplary MRAM system 80(2) comprising a write driver circuit 82(2) configured to reduce voltage change in the selector circuit 84 in FIG. 4 during a write operation, thus reducing the footprint of the selector circuit 84. Common elements between FIGS. 4 and 7 are shown with common element numbers, and thus will not be re-described herein.

The write driver circuit 82(2) comprises a precharging circuit 200 to precharge the selector circuit 84 to a precharge voltage 202 prior to the write operation. During the write operation, a control signal 96 causes the precharging circuit 200 to decouple from the selector circuit 84. The control signal 96 also causes the current source 88 to be coupled to the selector circuit 84 through the isolation circuit 94. In a non-limiting example, decoupling of the precharging circuit 200 and coupling of the current source 88 take place simultaneously. During the write operation, the write voltage 98 is provided by the current source 88 to the selector circuit 84. In a non-limiting example, the write voltage 98 is greater than the precharge voltage 202. By precharging the selector circuit 84 to the precharge voltage 202, a smaller voltage variation (e.g., a differential of the write voltage 98 and the precharge voltage 202) is provided to the selector circuit 84 for the write operation. As a result, the N BL transistors 114(0)-114(N−1) and the N SL transistors 116(0)-116(N−1) may be provided with smaller transistors (e.g., core transistors) that have a thinner oxide layer, thus resulting in a reduced footprint of the selector circuit 84. It is to be noted that the precharge voltage 202 is only intended to precharge the selector circuit 84. In this regard, the precharge voltage 202 shall not be confused with an MRAM bitcell precharge voltage (not shown) that is applied to an MRAM bitcell(s) 104 prior to accessing (e.g., reading from or writing to) the MRAM bitcell(s).

With continuing reference to FIG. 7, the precharging circuit 200, for example, comprises a precharge transistor 204. The precharge transistor 204 comprises a precharge transistor G terminal 206, a precharge transistor D terminal 208, and a precharge transistor S terminal 210. Like the isolation transistor D terminal 138, the precharge transistor D terminal 208 is also coupled to the BL transistor S terminal 124(0) and the SL transistor S terminal 132(0). The precharge transistor S terminal 210 is coupled to a precharge voltage source 212, which is configured to provide the precharge voltage 202 to the precharging circuit 200. In a non-limiting example, the precharge voltage 202 is equal to a voltage $V_{DD}$ (not shown). In another non-limiting example, the precharge voltage 202 is less than the write voltage 98. The write driver circuit 82(2) further comprises an inverter 214. The inverter 214 is configured to receive the control signal 96 on an input (I) terminal 216. Because the control signal 96 is also received by the isolation transistor G terminal 136 of the isolation transistor 134, the BL isolation transistor G terminal 136(1) of the BL isolation transistor 134(1), and the SL isolation transistor G terminal 136(2) of the SL isolation transistor 134(2), the I terminal 216 is also coupled with the isolation transistor G terminal 136, the BL isolation transistor G terminal 136(1), and the SL isolation transistor G terminal 136(2). In a non-limiting example, the control signal 96 is configured to indicate either a precharge state (not shown) or the write state (not shown). The precharge state may be provided by asserting the control signal 96 to a logic low, and the write state may be provided by asserting the control signal 96 to a logic high, for example. In this regard, if the control signal 96 is asserted as the logic low, the inverter 214 inverts the control signal 96 to an inverted control signal 96' representing the logic high. The inverter 214 then provides the inverted control signal 96' from an output (0) terminal 218 to the precharge transistor G terminal 206. In this regard, when the control signal 96 is provided as the logic low, the precharging circuit 200 is coupled to the selector circuit 84 while the isolation circuit 94 is decoupled from the selector circuit 84. In contrast, when the control signal 96 is provided as the logic high, the isolation circuit 94 is coupled to the selector circuit 84 while the precharging circuit 200 is decoupled from the selector circuit 84. In other words, the inverter 214 can ensure that the isolation circuit 94 and the precharging circuit 200 are not coupled to the selector circuit 84 at the same time.

With continuing reference to FIG. 7, when the selector circuit 84 is on standby, the isolation circuit 94 decouples the current source 88 from the coupling element 112(0) and consequently decouples the current source 88 from the MRAM bitcell 104(0,0). As a result, there is little current flowing through the BL transistor 114(0) or the SL transistor 116(0) in the coupling element 112(0), thus leading to a reduced leakage current in the selector circuit 84. When writing data to the MRAM bitcell 104(0,0), the isolation circuit 94 couples the current source 88 to the coupling element 112(0) to provide the write voltage 98. If a logical '0' is to be written to the MRAM bitcell 104(0,0), the BL-enablement signal 122(0) is asserted and the switching current 90 flows from the current source 88 to the MRAM bitcell 104(0,0) through the BL transistor 114(0). The switching current 90 sinks at the write current sink 111(0). If a logical '1' is to be written to the MRAM bitcell 104(0,0), the SL-enablement signal 130(0) is asserted and the switching current 92 flows from the current source 88 to the MRAM bitcell 104(0,0) through the SL transistor 116(0). Again, the switching current 92 sinks at the write current sink 111(0). However, the BL transistor 114(0) and the SL transistor 116(0) must be designed to handle instantaneous voltage swing from a level of zero or near zero, to levels of the write voltage 98. As a result, the BL transistor 114(0) and the SL transistor 116(0) must be larger-size transistors made with thicker oxide layers, thus causing an increased footprint of the selector circuit 84.

With continuing reference to FIG. 7, the precharging circuit 200 is provided in the write driver circuit 82(2) to help reduce the footprint of the selector circuit 84. Prior to writing data to the MRAM bitcell 104(0,0), the precharging circuit 200 is coupled to the coupling element 112(0) and the isolation circuit 94 is decoupled from the coupling element 112(0). By coupling the precharging circuit 200 to the coupling element 112(0), the precharge voltage 202 is provided to the BL transistor 114(0) and the SL transistor 116(0). As previously discussed, the precharge voltage 202 is less than the write voltage 98 provided by the current source 88 in this example. During the write operation to the MRAM bitcell 104(0,0), the precharging circuit 200 is decoupled from the coupling element 112(0) and the isolation circuit 94 is coupled to the coupling element 112(0) to provide the write voltage 98 and the switching current 90 or 92 to the MRAM bitcell 104(0,0). Since the BL transistor 114(0) and the SL transistor 116(0) have been pre-charged to the precharge voltage 202, the instantaneous voltage swing in the BL transistor 114(0) and the SL transistor 116(0) is reduced. As a result, the BL transistor 114(0) and the SL transistor 116(0) may be provided as smaller-size transistors (e.g., core transistors) made with thinner oxide layers, thus leading to a reduced footprint of the selector circuit 84.

Figure 8:
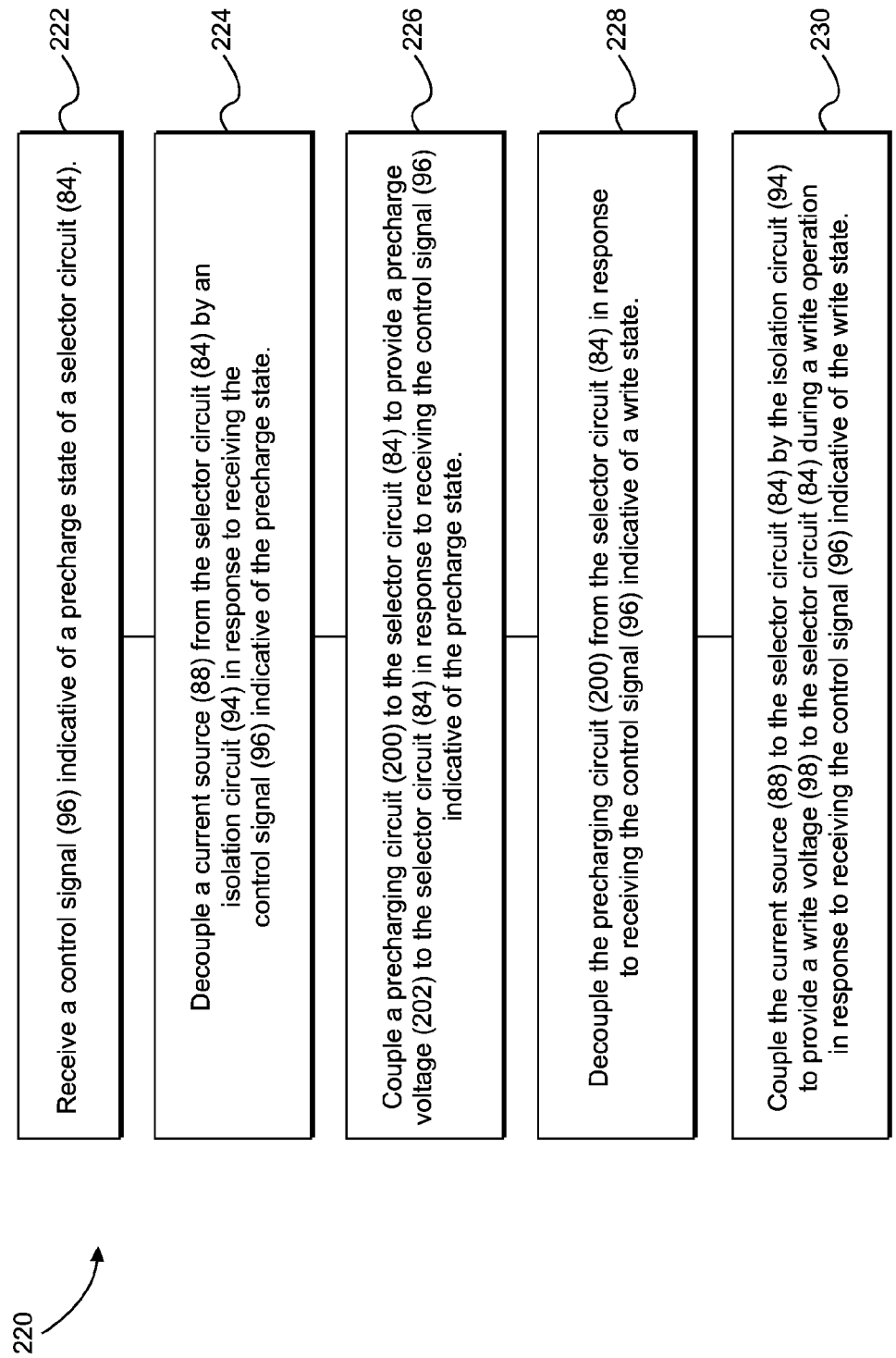
FIG. 8 is a flowchart illustrating an exemplary write driver process for reducing footprint of the selector circuit in FIG. 7.

FIG. 8 is a flowchart illustrating an exemplary write driver process 220 for reducing the footprint of the selector circuit 84 in FIG. 7. Elements of FIG. 7 are referenced in connection to FIG. 8 and will not be re-described herein. According to the write driver process 220, the write driver circuit 82(2) receives the control signal 96 indicative of the precharge state of the selector circuit 84 (block 222). In response to receiving the control signal 96 indicative of the precharge state, the isolation circuit 94 decouples the current source 88 from the selector circuit 84 (block 224). Also in response to receiving the control signal 96 indicative of the precharge state, the precharging circuit 200 is coupled to the selector circuit 84 to provide the precharge voltage 202 to the selector circuit 84 (block 226). Subsequently, in response to receiving the control signal 96 indicative of the write state, the precharging circuit 200 is decoupled from the selector circuit 84 (block 228). Also in response to receiving the control signal 96 indicative of the write state, the isolation circuit 94 couples the current source 88 to the selector circuit 84 to provide the write voltage 98 to the selector circuit 84 during the write operation (block 230).

Figure 9:
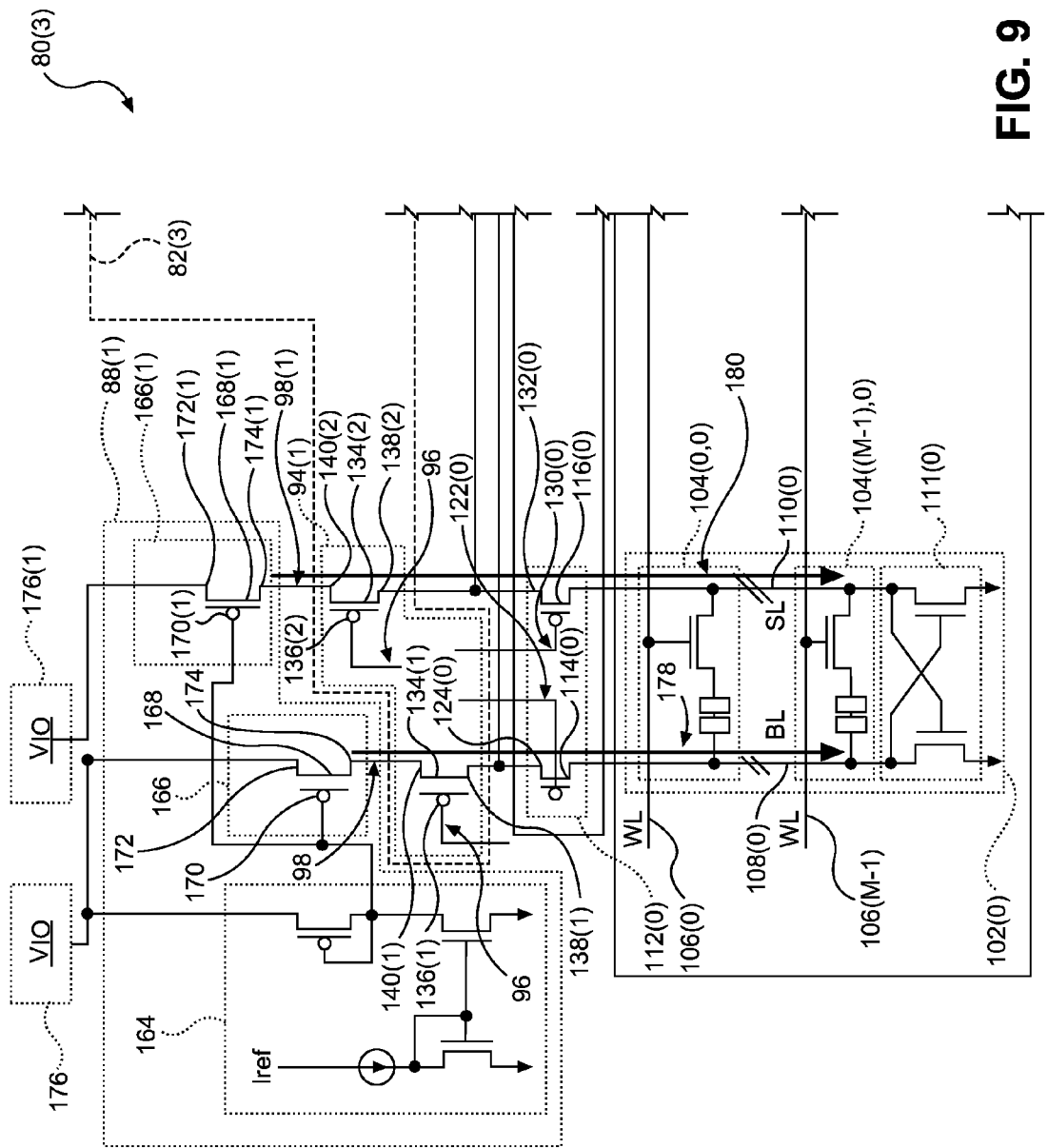
FIG. 9 is a diagram of an exemplary MRAM system comprising a write driver circuit configured to provide a BL switching current and a SL switching current in FIG. 6 to BLs and SLs in FIG. 9, respectively.
Figure 9:
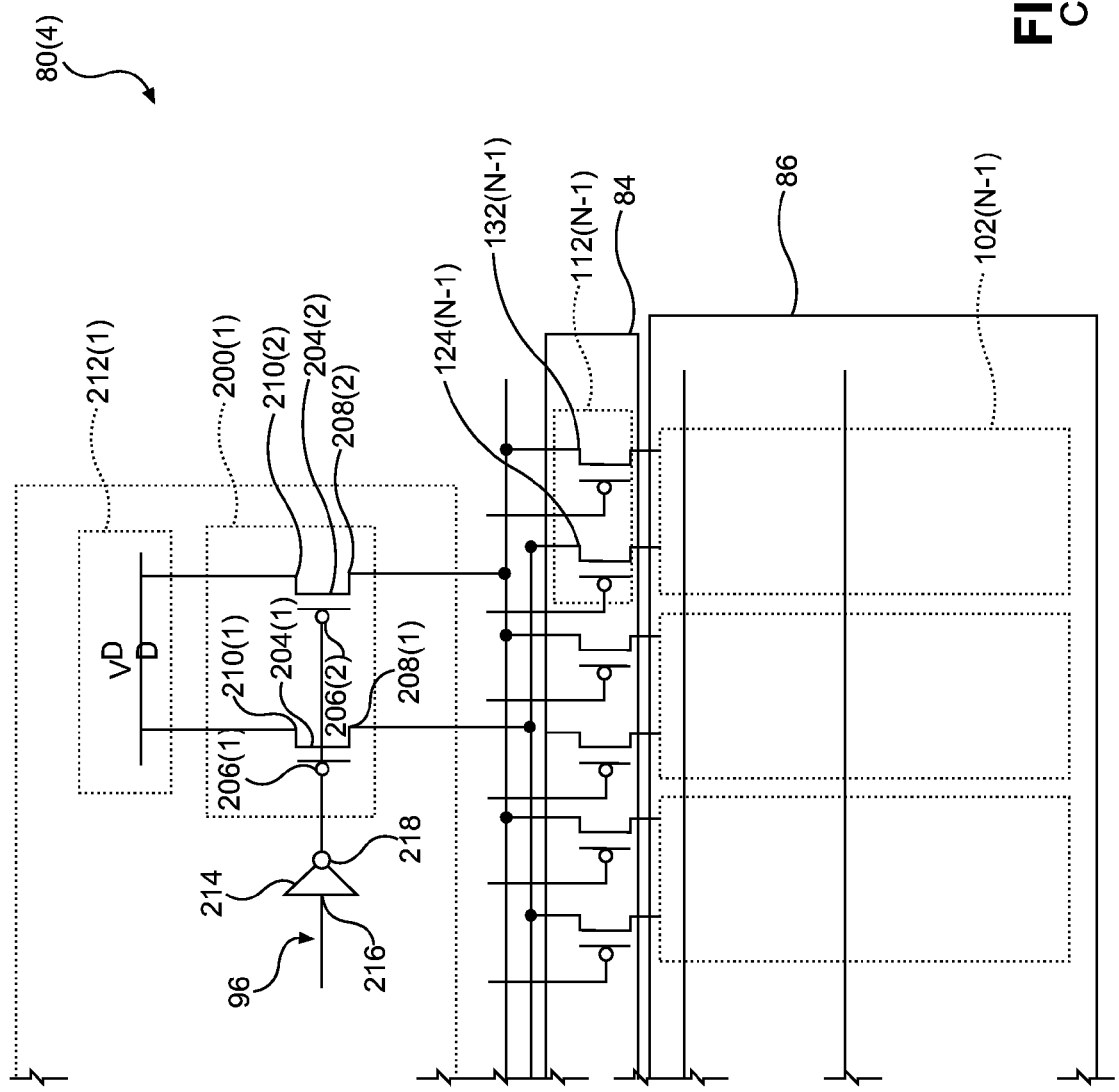

According to FIG. 7, the N BLs 108(0)-108(N−1) and the N SLs 110(0)-110(N−1) are both coupled to the current source 88. However, the N BLs 108(0)-108(N−1) and the N SLs 110(0)-110(N−1) in the MRAM system 80(2) may also be coupled to individual current sources. In this regard, FIG. 9 is a diagram of an exemplary MRAM system 80(3) comprising a write driver circuit 82(3) configured to provide the BL switching current 178 and the SL switching current 180 in FIG. 6 to the N BLs 108(0)-108(N−1) and the N SLs 110(0)-110(N−1) in FIG. 9, respectively. Common elements between FIGS. 6, 7, and 9 are shown with common element numbers, and thus will not be re-described herein.

With reference to FIG. 9, the write driver circuit 82(3) comprises the isolation circuit 94(1) in FIG. 6, a precharging circuit 200(1), the current source 88(1) in FIG. 6, and a precharge voltage source 212(1). The precharging circuit 200(1) comprises a BL precharge transistor 204(1) and an SL precharge transistor 204(2). The BL precharge transistor 204(1) comprises a BL precharge transistor G terminal 206(1) coupled to the O terminal 218 of the inverter 214, a BL precharge transistor D terminal 208(1) coupled to the N BL transistor S terminals 124(0)-124(N−1) in the selector circuit 84, and a BL precharge transistor S terminal 210(1) coupled to the precharge voltage source 212(1). The SL precharge transistor 204(2) comprises an SL precharge transistor G terminal 206(2) coupled to the O terminal 218 of the inverter 214, an SL precharge transistor D terminal 208(2) coupled to the N SL transistor S terminals 132(0)-132(N−1) in the selector circuit 84, and an SL precharge transistor S terminal 210(2) coupled to the precharge voltage source 212(1). With such a precharging circuit arrangement, it is possible to precharge the N BLs 108(0)-108(N−1) and the N SLs 110(0)-110(N−1) to individual precharge voltages when needed.

The writer driver circuits for reducing resistive RAM leakage currents and switching current variations according to aspects disclosed herein may be provided in or integrated into any processor-based device. Examples, without limitation, include a set top box, an entertainment unit, a navigation device, a communications device, a fixed location data unit, a mobile location data unit, a mobile phone, a cellular phone, a computer, a portable computer, a desktop computer, a personal digital assistant (PDA), a monitor, a computer monitor, a television, a tuner, a radio, a satellite radio, a music player, a digital music player, a portable music player, a digital video player, a video player, a digital video disc (DVD) player, and a portable digital video player.

Figure 10:
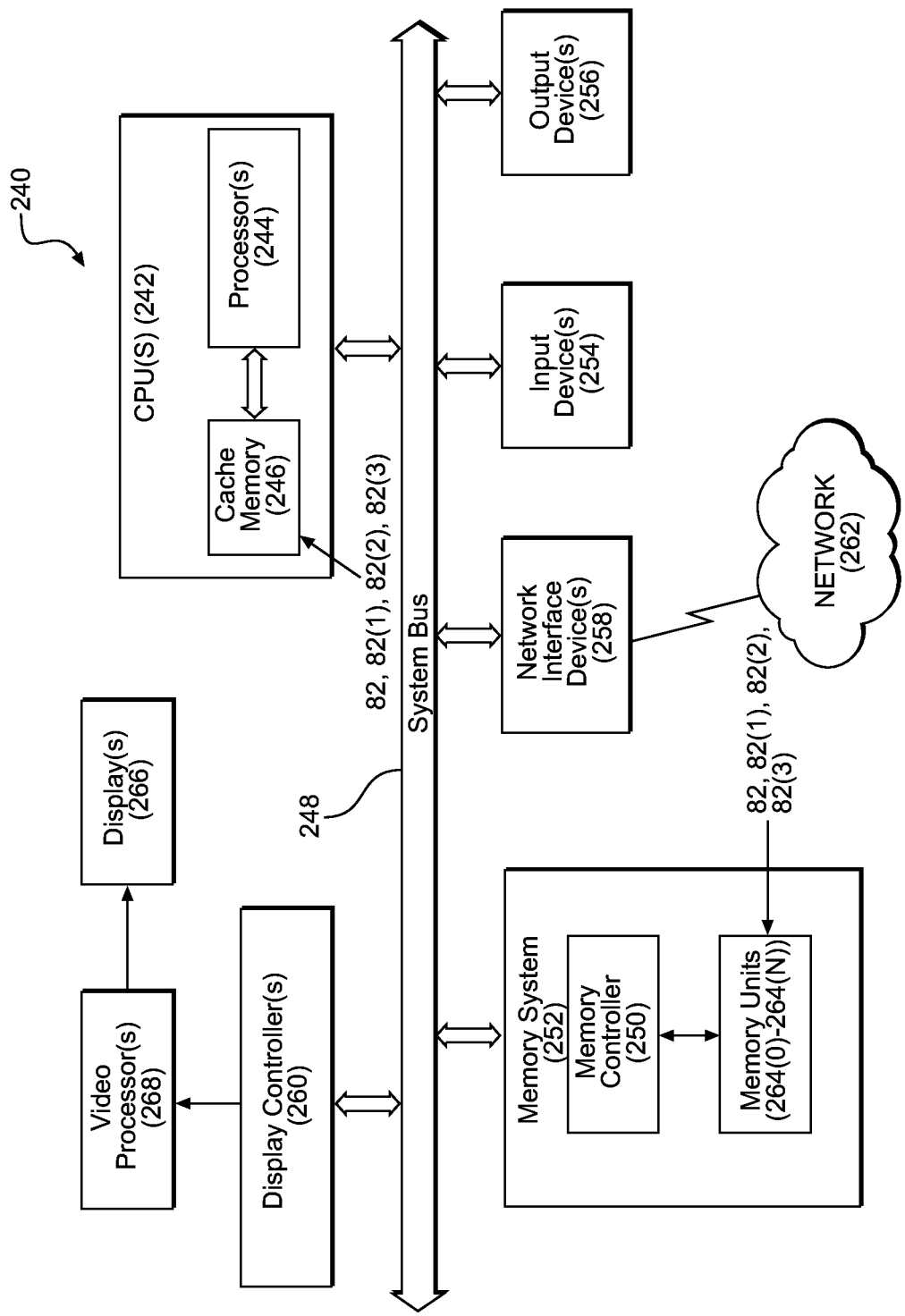
FIG. 10 illustrates an example of a processor-based system that can employ the write driver circuits illustrated in FIGS. 4, 6, 7, and 9, respectively, to reduce switching current variations in MRAM.

In this regard, FIG. 10 illustrates an example of a processor-based system 240 that can employ the write driver circuits 82, 82(1), 82(2), and 82(3) illustrated in FIGS. 4, 6, 7, and 9, respectively. In this example, the processor-based system 240 includes one or more central processing units (CPUs) 242, each including one or more processors 244. The CPU(s) 242 may have cache memory 246 coupled to the processor(s) 244 for rapid access to temporarily stored data. The cache memory 246 may employ the write driver circuits 82, 82(1), 82(2), and 82(3) illustrated in FIGS. 4, 6, 7, and 9, respectively. The CPU(s) 242 is coupled to a system bus 248 and can intercouple master and slave devices included in the processor-based system 240. As is well known, the CPU(s) 242 communicates with these other devices by exchanging address, control, and data information over the system bus 248. For example, the CPU(s) 242 can communicate bus transaction requests to a memory controller 250 as an example of a slave device. Although not illustrated in FIG. 10, multiple system buses 248 could be provided, wherein each system bus 248 constitutes a different fabric.

Other master and slave devices can be connected to the system bus 248. As illustrated in FIG. 10, these devices can include a memory system 252, one or more input devices 254, one or more output devices 256, one or more network interface devices 258, and one or more display controllers 260, as examples. The input device(s) 254 can include any type of input device, including but not limited to input keys, switches, voice processors, etc. The output device(s) 256 can include any type of output device, including but not limited to audio, video, other visual indicators, etc. The network interface device(s) 258 can be any device configured to allow exchange of data to and from a network 262. The network 262 can be any type of network, including but not limited to a wired or wireless network, a private or public network, a local area network (LAN), a wide local area network (WLAN), or the Internet. The network interface device(s) 258 can be configured to support any type of communications protocol desired. The memory system 252 can include one or more memory units 264(0)-264(N) that may employ the write driver circuits 82, 82(1), 82(2), and 82(3) illustrated in FIGS. 4, 6, 7, and 9, respectively.

The CPU(s) 242 may also be configured to access the display controller(s) 260 over the system bus 248 to control information sent to one or more displays 266. The display controller(s) 260 sends information to the display(s) 266 to be displayed via one or more video processors 268, which process the information to be displayed into a format suitable for the display(s) 266. The display(s) 266 can include any type of display, including but not limited to a cathode ray tube (CRT), a liquid crystal display (LCD), a plasma display, etc.

Those of skill in the art will further appreciate that the various illustrative logical blocks, modules, circuits, and algorithms described in connection with the aspects disclosed herein may be implemented as electronic hardware, instructions stored in memory or in another computer-readable medium and executed by a processor or other processing device, or combinations of both. The master and slave devices described herein may be employed in any circuit, hardware component, integrated circuit (IC), or IC chip, as examples. Memory disclosed herein may be any type and size of memory and may be configured to store any type of information desired. To clearly illustrate this interchangeability, various illustrative components, blocks, modules, circuits, and steps have been described above generally in terms of their functionality. How such functionality is implemented depends upon the particular application, design choices, and/or design constraints imposed on the overall system. Skilled artisans may implement the described functionality in varying ways for each particular application, but such implementation decisions should not be interpreted as causing a departure from the scope of the present disclosure.

The various illustrative logical blocks, modules, and circuits described in connection with the aspects disclosed herein may be implemented or performed with a processor, a Digital Signal Processor (DSP), an Application Specific Integrated Circuit (ASIC), a Field Programmable Gate Array (FPGA) or other programmable logic device, discrete gate or transistor logic, discrete hardware components, or any combination thereof designed to perform the functions described herein. A processor may be a microprocessor, but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

The aspects disclosed herein may be embodied in hardware and in instructions that are stored in hardware, and may reside, for example, in Random Access Memory (RAM), flash memory, Read Only Memory (ROM), Electrically Programmable ROM (EPROM), Electrically Erasable Programmable ROM (EEPROM), registers, a hard disk, a removable disk, a CD-ROM, or any other form of computer readable medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a remote station. In the alternative, the processor and the storage medium may reside as discrete components in a remote station, base station, or server.

It is also noted that the operational steps described in any of the exemplary aspects herein are described to provide examples and discussion. The operations described may be performed in numerous different sequences other than the illustrated sequences. Furthermore, operations described in a single operational step may actually be performed in a number of different steps. Additionally, one or more operational steps discussed in the exemplary aspects may be combined. It is to be understood that the operational steps illustrated in the flowchart diagrams may be subject to numerous different modifications as will be readily apparent to one of skill in the art. Those of skill in the art will also understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The previous description of the disclosure is provided to enable any person skilled in the art to make or use the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples and designs described herein, but is to be accorded the widest scope consistent with the principles and novel features disclosed herein.

What is claimed is:

1. A write driver circuit for writing data to a resistive random access memory (RAM) array, comprising:
    an isolation circuit coupled to:
        a current source; and
        a selector circuit configured to select one or more resistive RAM bitcells in a resistive RAM array for a write operation; and
    a precharging circuit coupled to a precharge voltage source and the selector circuit;
    wherein the isolation circuit is configured to:
        receive a control signal;
        couple the current source to the selector circuit to provide a write voltage to the one or more resistive RAM bitcells selected by the selector circuit if the control signal indicates a write state for the write operation; and
        decouple the current source from the selector circuit if the control signal does not indicate the write state;
    wherein the precharging circuit is configured to:
        couple the precharge voltage source to the selector circuit to provide a precharge voltage to a plurality of coupling elements in the selector circuit if the control signal indicates a precharge state for precharging the selector circuit; and
        decouple the precharge voltage source from the plurality of coupling elements in the selector circuit if the control signal does not indicate the precharge state for precharging the selector circuit.

2. The write driver circuit of claim 1, wherein each of the plurality of coupling elements comprises:
    a bit line (BL) transistor coupled to a respective BL in the resistive RAM array; and
    a source line (SL) transistor coupled to a respective SL in the resistive RAM array.

3. The write driver circuit of claim 2, wherein the isolation circuit is further configured to:
    couple the current source to one or more BL transistors and one or more SL transistors in the selector circuit to provide the write voltage to the one or more resistive RAM bitcells selected by the selector circuit if the control signal indicates the write state; and
    decouple the current source from the one or more BL transistors and the one or more SL transistors in the selector circuit if the control signal does not indicate the write state.

4. The write driver circuit of claim 2, wherein the isolation circuit is further configured to:
    couple a BL current source and an SL current source to one or more BL transistors and one or more SL transistors in the selector circuit, respectively, to provide the write voltage to the one or more resistive RAM bitcells selected by the selector circuit if the control signal indicates the write state; and
    decouple the BL current source and the SL current source from the one or more BL transistors and the one or more SL transistors in the selector circuit, respectively, if the control signal does not indicate the write state.

5. The write driver circuit of claim 2, wherein the precharging circuit is further configured to:
    couple the precharge voltage source to each BL transistor and each SL transistor in the selector circuit if the control signal indicates the precharge state; and
    decouple the precharge voltage source from each BL transistor and each SL transistor in the selector circuit if the control signal does not indicate the precharge state.

6. The write driver circuit of claim 2, wherein the write voltage is greater than the precharge voltage.

7. The write driver circuit of claim 2, further comprising an inverter configured to:
    receive the control signal that indicates the write state; and
    generate an inverted control signal to decouple the precharging circuit from the selector circuit.

8. The write driver circuit of claim 2, further comprising an inverter configured to:
    receive the control signal that indicates the precharge state; and
    generate an inverted control signal to couple the precharging circuit to the selector circuit.

9. The write driver circuit of claim 1, wherein the resistive RAM array is a magnetoresistive RAM (MRAM) array.

10. A means for writing data to a resistive random access memory (RAM) array, comprising:
    a means for isolation coupled to:
        a current source; and
        a selector circuit configured to select one or more resistive RAM bitcells in a resistive RAM array for a write operation; and
    a precharging circuit coupled to a precharge voltage source and the selector circuit;
    wherein the means for isolation is configured to:
        receive a control signal;
        couple the current source to the selector circuit to provide a write voltage to the one or more resistive RAM bitcells selected by the selector circuit if the control signal indicates a write state for the write operation; and
        decouple the current source from the selector circuit if the control signal does not indicate the write state;
    wherein the precharging circuit is configured to:
        couple the precharge voltage source to the selector circuit to provide a precharge voltage to a plurality of coupling elements in the selector circuit if the control signal indicates a precharge state for precharging the selector circuit; and decouple the precharge voltage source from the plurality of coupling elements in the selector circuit if the control signal does not indicate the precharge state for precharging the selector circuit.

11. A method for providing a write voltage to a resistive random access memory (RAM) array during a write operation, comprising:

receiving a control signal by an isolation circuit;

coupling a current source to a selector circuit if the control signal indicates a write state, wherein the current source is configured to provide the write voltage to one or more resistive RAM bitcells selected by the selector circuit for the write operation;

decoupling the current source from the selector circuit if the control signal does not indicate the write state;

coupling a precharging circuit to the selector circuit to provide a precharge voltage to the selector circuit if the control signal indicates a precharge state; and decoupling the precharging circuit from the selector circuit if the control signal does not indicate the precharge state.

12. The method of claim 11, wherein:

coupling the current source to the selector circuit comprises coupling the current source to one or more bit line (BL) transistors and one or more source line (SL) transistors in the selector circuit; and decoupling the current source from the selector circuit comprises decoupling the current source from the one or more BL transistors and the one or more SL transistors in the selector circuit.

13. The method of claim 11, further comprising decoupling the isolation circuit from the selector circuit and coupling the precharging circuit to the selector circuit simultaneously in response to receiving the control signal that indicates the precharge state.

14. The method of claim 11, further comprising decoupling the precharging circuit from the selector circuit and coupling the isolation circuit to the selector circuit simultaneously in response to receiving the control signal that indicates the write state.

15. The method of claim 11, further comprising providing the write voltage greater than the precharge voltage to the resistive RAM array in response to receiving the control signal that indicates the write state.

16. A resistive random access memory (RAM) system, comprising:

a resistive RAM array comprising a plurality of resistive RAM bitcells arranged into M rows and N columns, wherein M and N are finite integers;

wherein each of the M rows comprises N resistive RAM bitcells coupled to a respective word line (WL);

wherein each of the N columns comprises M resistive RAM bitcells coupled to a respective bit line (BL) and a respective source line (SL);

a selector circuit comprising N coupling elements, wherein each of the N coupling elements is configured to be coupled to a respective column among the N columns in the resistive RAM array for a write operation;

a write driver circuit comprising an isolation circuit coupled to the selector circuit and a current source; wherein the isolation circuit is configured to:

receive a control signal;

couple the current source to the selector circuit to provide a write voltage to one or more resistive RAM bitcells selected by the selector circuit if the control signal indicates a write state for the write operation; and decouple the current source from the selector circuit if the control signal does not indicate the write state;

a precharging circuit coupled to the N coupling elements in the selector circuit;

a precharge voltage source coupled to the precharging circuit; and an inverter, comprising:

an input (I) terminal coupled to the isolation circuit; and an output (O) terminal coupled to the precharging circuit.

17. The resistive RAM system of claim 16, wherein each coupling element among the N coupling elements in the selector circuit comprises:

a BL transistor, comprising:

a BL transistor gate (G) terminal;

a BL transistor source (S) terminal coupled to the isolation circuit; and a BL transistor drain (D) terminal coupled to the respective BL in the respective column of the resistive RAM array; and an SL transistor, comprising:

an SL transistor G terminal;

an SL transistor S terminal coupled to the isolation circuit; and an SL transistor D terminal coupled to the respective SL in the respective column of the resistive RAM array.

18. The resistive RAM system of claim 17, wherein the BL transistor and the SL transistor are core transistors.

19. The resistive RAM system of claim 17, wherein the precharging circuit comprises a precharge transistor comprising:

a precharge transistor G terminal coupled to the O terminal of the inverter;

a precharge transistor S terminal coupled to the precharge voltage source; and a precharge transistor D terminal coupled to the BL transistor S terminal and the SL transistor S terminal in each of the N coupling elements of the selector circuit.

20. The resistive RAM system of claim 19, wherein the isolation circuit comprises an isolation transistor, the isolation transistor comprising:

an isolation transistor G terminal coupled to the I terminal of the inverter;

an isolation transistor S terminal coupled to the current source; and an isolation transistor D terminal coupled to the BL transistor S terminal and the SL transistor S terminal in each of the N coupling elements of the selector circuit.

21. The resistive RAM system of claim 16, wherein the precharging circuit comprises:

a BL precharge transistor, comprising:

a BL precharge transistor gate (G) terminal coupled to the O terminal of the inverter;

a BL precharge transistor source (S) terminal coupled to the precharge voltage source, wherein the precharge voltage source is configured to receive a precharge voltage; and a BL precharge transistor drain (D) terminal coupled to a BL transistor S terminal in each of the N coupling elements of the selector circuit; and an SL precharge transistor, comprising:
   an SL precharge transistor G terminal coupled to the O terminal of the inverter;
   an SL precharge transistor S terminal coupled to the precharge voltage source, wherein the precharge voltage source is configured to receive the precharge voltage; and
   an SL precharge transistor D terminal coupled to an SL transistor S terminal in each of the N coupling elements of the selector circuit.

22. The resistive RAM system of claim 16, wherein the current source comprises:
   a current mirror circuit;
   a BL current source comprising a BL current source transistor, wherein the BL current source transistor comprises:
      a BL current source transistor gate (G) terminal coupled to the current mirror circuit;
      a BL current source transistor source (S) terminal coupled to a write voltage source, wherein the BL current source transistor S terminal is configured to receive a BL write voltage; and
      a BL current source transistor drain (D) terminal; and
   an SL current source comprising an SL current source transistor, wherein the SL current source transistor comprises:
      an SL current source transistor G terminal coupled to the current mirror circuit;
      an SL current source transistor S terminal coupled to the write voltage source, wherein the SL current source transistor S terminal is configured to receive an SL write voltage; and
      an SL current source transistor D terminal.

23. The resistive RAM system of claim 22, wherein the isolation circuit comprises:
   a BL isolation transistor, comprising:
      a BL isolation transistor G terminal coupled to the I terminal of the inverter;
      a BL isolation transistor S terminal coupled to the BL current source transistor D terminal; and
      a BL isolation transistor D terminal coupled to a BL transistor S terminal in each of the N coupling elements of the selector circuit; and
   an SL isolation transistor, comprising:
      an SL isolation transistor G terminal coupled to the I terminal of the inverter;
      an SL isolation transistor S terminal coupled to the SL current source transistor D terminal; and
      an SL isolation transistor D terminal coupled to an SL transistor S terminal in each of the N coupling elements of the selector circuit.

24. The resistive RAM system of claim 16, wherein the resistive RAM array comprises N write current sinks coupled to a bottom of the N columns in the resistive RAM array, respectively.

25. The resistive RAM system of claim 24, wherein each of the N write current sinks comprises:
   a first write current sink transistor, comprising:
      a first write current sink transistor gate (G) terminal coupled to the respective SL of the respective column among the N columns;
      a first write current sink transistor source (S) terminal coupled to the respective BL of the respective column among the N columns; and
      a first write current sink transistor drain (D) terminal coupled to ground (GND); and
   a second write current sink transistor, comprising:
      a second write current sink transistor G terminal coupled to the respective BL of the respective column among the N columns;
      a second write current sink transistor S terminal coupled to the respective SL of the respective column among the N columns; and
      a second write current sink transistor D terminal coupled to the GND.

26. The resistive RAM system of claim 16, wherein the selector circuit is a multiplexer (MUX) circuit.

* * * * *